United States Patent [19]

Maruyama

[11] Patent Number: 5,440,503

[45] Date of Patent: Aug. 8, 1995

[54] DIGITAL FILTERING CIRCUIT OPERABLE AS A THREE-STAGE MOVING AVERAGE FILTER

[75] Inventor: Yuichi Maruyama, Tokyo, Japan

[73] Assignee: NEC Corporation

[21] Appl. No.: 196,532

[22] Filed: Feb. 15, 1994

[30] Foreign Application Priority Data

Feb. 15, 1993 [JP] Japan .................................. 5-024619

[51] Int. Cl.$^6$ .......................... G06F 15/31; H03H 3/00
[52] U.S. Cl. .............................. 364/724.1; 364/724.01;
364/724.17; 364/724.16; 341/143
[58] Field of Search ........... 364/724.1, 724.01, 724.13,
364/724.16, 724.17, 724.19; 341/143, 144, 155,
141, 152, 118

[56] References Cited

U.S. PATENT DOCUMENTS

| | | | |
|---|---|---|---|
| 4,193,118 | 5/1980 | Nash et al. | 364/734 |
| 4,764,967 | 8/1988 | Christopher | 364/724.01 |
| 5,191,332 | 2/1991 | Shieu | 341/143 |
| 5,311,181 | 5/1993 | Ferguson, Jr. et al. | 341/143 |

OTHER PUBLICATIONS

James C. Candy et al., "A Voiceband Codec with Digital Filtering", IEEE Transactions on Communications, vol. COM-29, No. 6, Jun. 1981, pp. 815–830.

Primary Examiner—Roy N. Envall, Jr.
Assistant Examiner—Emmanuel L. Moise
Attorney, Agent, or Firm—Foley & Lardner

[57] ABSTRACT

In a digital filtering circuit for converting an input data signal (a) of a sampling frequency $f_s$ into an output data signal (OUT) of an oversampling frequency $Nf_s$ which is N times the sampling frequency $f_s$. The digital filtering circuit comprises a combination of a calculating circuit (30), and first and second integrating circuits (40, 50). The first integrating circuit (40) integrates a calculated signal (d) in synchronism with the oversampling frequency $Nf_s$ to produce a first integration result signal (b) and a first delayed signal (e). The second integrating circuit (50) integrates the first delayed signal (e) in synchronism with the oversampling frequency $Nf_s$ to produce a second integration result signal (c) and a second delayed signal (f) as the output data signal (OUT). The calculating circuit (30) carries out a predetermined calculation on the input data signal (a), the first integration result signal (b), and the second integration result signal (c) in synchronism with the sampling frequency $f_s$ to produce the calculated signal (d). The predetermined calculation is represented by an equation as follows:

$$d = \{a - c - (1 + 3N)b/2\}/N^2.$$

8 Claims, 5 Drawing Sheets

DIGITAL FILTERING CIRCUIT OPERABLE AS A THREE-STAGE MOVING AVERAGE FILTER

BACKGROUND OF THE INVENTION

This invention relates to a digital filtering circuit and, more particularly, to a digital filtering circuit for interpolation for use in a digital-to-analog converter (DAC) of oversampling type.

As well known in the art, the digital-to-analog converter of the oversampling type carries out a digital-to-analog (D/A) conversion operation at a higher sampling frequency which is tens of or hundreds of times as large as a normal sampling frequency or the Nyquist rate. The higher sampling frequency is called an oversampling frequency. By using the oversampling frequency, it is possible to distribute quantizing noise into a wider frequency area and resulting in decreasing the quantizing noise in a desired frequency band. This means that it is possible to improve a signal-to-noise ratio (S/N) by sampling at the oversampling frequency although quantization bit number is the same on D/A conversion. It is therefore possible to reduce the quantization bit number by using the oversampling frequency with respect to the same signal-to-noise ratio.

In addition, in D/A conversion, an image signal necessarily generates in out-of-band. To remove the image signal, an analog filter is necessary. Such an analog filter is referred to as a post-filter. A normal digital-to-analog converter of no oversampling type is called a digital-to-analog converter of the Nyquist sampling type. It is necessary for the digital-to-analog converter of the Nyquist sampling type to use a high accuracy post-filter which has a rapid frequency characteristic to remove the image signal. By using the digital-to-analog converter of the oversampling type, the post-filter is implemented by a filter which is simple in structure and it is possible to reduce analog circuits. However, the image signal is present at every Nyquist sampling frequency if data of the Nyquist sampling frequency is directly converted to an analog signal at the oversampling frequency. As a result, it is impossible to reduce a characteristic of the post-filter. In the digital-to-analog converter of the oversampling type, in order to reduce the characteristic of the post-filter, the image signal is removed by a digital filter. The digital filter is called an interpolation filter.

The interpolation filter comprises first through M-th digital filtering circuits, where M represents a positive integer which is not less than two. The first stage digital filtering circuit has a function of a low-pass filter for removing the image signal having a high frequency. To reduce a scale of a digital circuit, the first stage digital filtering circuit is operable as a first sampling frequency which is higher than the Nyquist sampling frequency and is lower than the oversampling frequency. The second through the M-th stage digital filtering circuits are operable as second through M-th sampling frequencies, respectively, which rise in ascending order. The M-th sampling frequency is equal to the oversampling frequency. Inasmuch as an image signal may occupy all over the frequency range except for the desired frequency band dependent on an input signal thereof, the first stage digital filtering circuit must attenuate the image signal in the above-mentioned frequency range. Each of the second through the M-th stage digital filtering circuits may use a filter having a comb-shaped characteristic because an image signal in low-pass filter output occupies only every Nyquist sampling frequency in all of the frequency range of the out-of-band.

The first stage digital filtering circuit must use an advanced low-pass filter implemented by a digital signal processor (DSP). This is because it is necessary to attenuate all of signals laid on the out-of-band as mentioned before. However, each of the second through the M-th stage digital filtering circuits may use a filter which is simple in structure and which is called a moving average filter. This is because this filter may be realized by the filter having the comb-shaped characteristic as mentioned before. Inasmuch as only one moving average filter has an insufficient attenuation to attenuate the image signal, a plurality of moving average filters are used to obtain a sufficient attenuation for the image signal.

In general, the moving average filter is implemented by a finite impulse response (FIR) type filter. Inasmuch as a plurality of FIR type filters must be used, it results in increasing a scale of the circuit. To resolve this defect, a linear interpolating circuit is disclosed in an article which is contributed by James C. Candy et al to IEEE TRANSACTIONS ON COMMUNICATIONS, VOL. COM-29, No. 6 (June 1981), pages 815–830, and which has a title of "A Voiceband Codec with Digital Filtering." The linear interpolating circuit serves as a two-stage moving average filter. The linear interpolating circuit raises a sampling frequency of an input data signal thereof to an oversampling frequency which is N times the sampling frequency by linearly interpolating (N−1) interpolation data elements between each pair of consecutive input data elements (a current input data element IDc and a previous input data element IDp) appearing at the low-pass filter output, where N represents a predetermined positive integer which is not less than two. The (N-1) interpolation data elements linearly change between the current input data element IDc and the previous input data element IDp as mentioned before. As a result, the linear interpolating circuit produces an output data signal consisting of a plurality of output data elements each of which has variation V which is represented by:

$$V = (IDc - IDp)/N.$$

In addition, the previous input data element IDp is always obtained by the output data elements.

In the manner which will later be described, a conventional digital filtering circuit is advantageous in that it occupies a large area on a large scale integration (LSI) chip. In addition, it is necessary to manually reset the digital filtering circuit on malfunction.

SUMMARY OF THE INVENTION

It is therefore an object of this invention to provide a digital filtering circuit which is operable as a three-stage moving average filter.

It is another object of this invention to provide a digital filtering circuit of the type described, which occupies a small area on an LSI chip.

It is still another object of this invention to provide a digital filtering circuit of the type described, which is capable of automatically resetting itself on malfunction.

Other objects of this invention will become clear as the description proceeds.

On describing the gist of this invention, it is possible to understand that a digital filtering circuit converts an input data signal of a sampling frequency $f_s$ into an output data signal of an oversampling frequency $Nf_s$ which is N times the sampling frequency $f_s$, where N represents a predetermined positive integer which is not less than two.

According to an aspect of this invention, the above-understood digital filter circuit comprises a first integrating circuit, supplied with a calculated signal, for integrating the calculated signal in synchronism with the oversampling frequency $Nf_s$ to produce a first integration result signal and a first delayed signal which is given by delaying the first integration result signal by a delay which is substantially equal to a reciprocal of the oversampling frequency $Nf_s$. Connected to the first integrating circuit, a second integrating circuit integrates the first delayed signal in synchronism with the oversampling frequency $Nf_s$ to produce a second integration result signal and a second delayed signal which is given by delaying the second integration result signal by the delay. The second integrating circuit produces the second delayed signal as the output data signal. Connected to the first and the second integrating circuits and supplied with the input data signal, a calculating circuit carries out a predetermined calculation on the input data signal, the first integration result signal, and the second integration result signal in synchronism with the sampling frequency $f_s$ to produce the calculated signal. The predetermined calculation is represented by an equation as follows:

$$d = \{a - c - (1+3N)b/2\}/N^2,$$

where a represents the input data signal, b represents the first integration result signal, c represents the second integration result signal, and d represents the calculated signal.

According to another aspect of this invention, the afore-understood digital filter circuit comprises a first integrating circuit, supplied with a calculated signal, for integrating the calculated signal in synchronism with the oversampling frequency $Nf_s$ to produce a first integration result signal. Connected to the first integrating circuit, a second integrating circuit integrates the first integration result signal in synchronism with the oversampling frequency $Nf_s$ to produce a second integration result signal and a delayed signal which is given by delaying the second integration result signal by a delay which is substantially equal to a reciprocal of the oversampling frequency $Nf_s$. The second integrating circuit produces the delayed signal as the output data signal. Connected to the first and the second integrating circuits and supplied with the input data signal, a calculating circuit carries out a predetermined calculation on the input data signal, the first integration result signal, and the second integration result signal in synchronism with the sampling frequency $f_s$ to produce the calculated signal. The predetermined calculation is represented by an equation as follows:

$$d = \{a - c - (1+3N)b/2\}/N^2,$$

where a represents the input data signal, b represents the first integration result signal, c represents the second integration result signal, and d represents the calculated signal.

DESCRIPTION OF THE PREFERRED EMBODIMENTS

Figure 1:
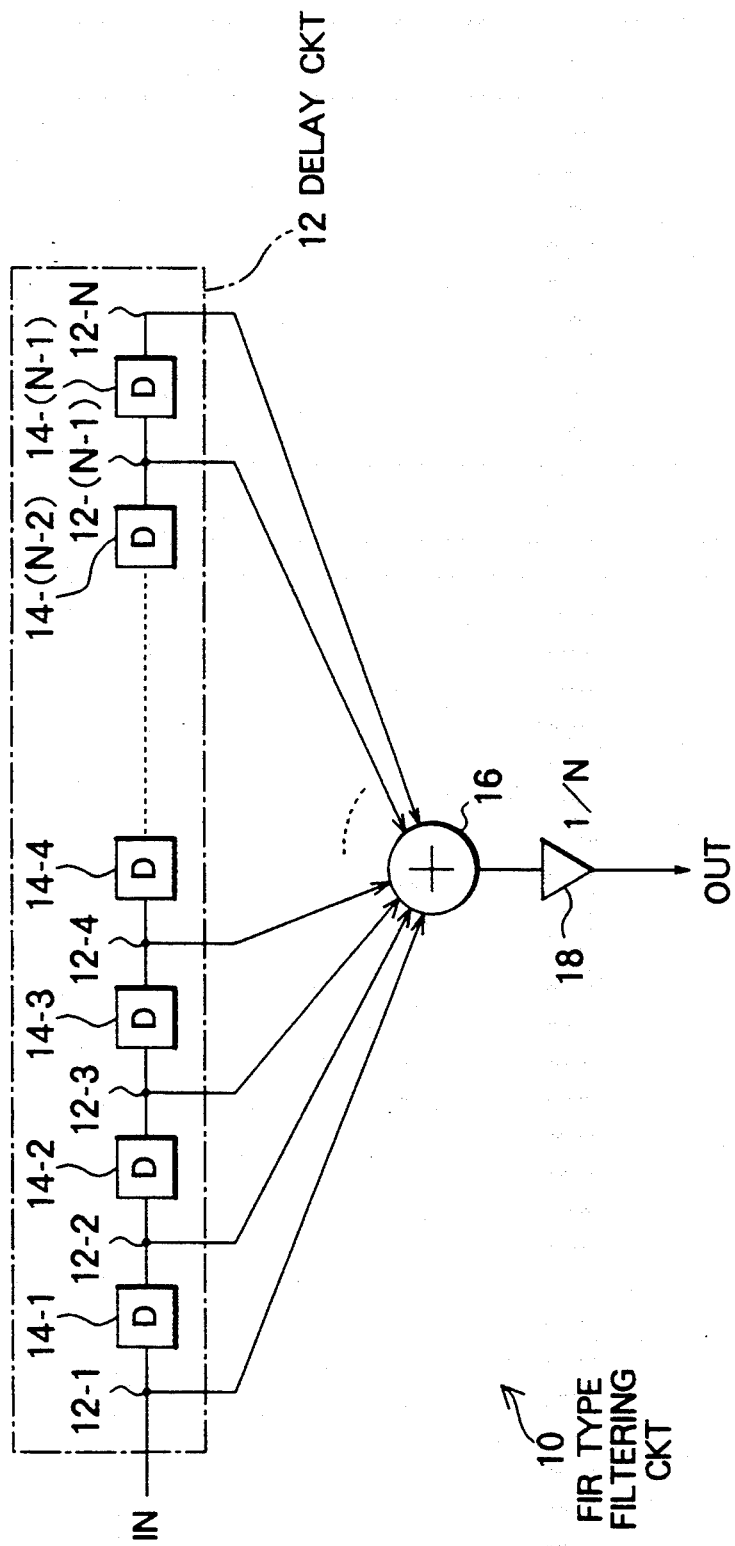
FIG. 1 is a block diagram of a conventional digital filtering circuit or an FIR type filter circuit.

Referring to FIG. 1, a conventional digital filtering circuit will be described at first in order to facilitate an understanding of the present invention. The illustrated digital filtering circuit is a finite impulse response (FIR) type filtering circuit 10 which acts as a moving average filter.

The FIR type filtering circuit 10 filters an input data signal IN into an output data signal OUT. The input data signal IN is a signal which is sampled at a sampling frequency $f_s$ and which is supplied from an advanced low-pass filter (not shown). The advanced low-pass filter is implemented by a digital signal processor (DSP). The FIR type filtering circuit 10 has an operation or an oversampling frequency $Nf_s$ which is N times the sampling frequency $f_s$, where N represents a predetermined positive integer which is not less than two.

The FIR type filtering circuit 10 comprises a delay circuit 12 which has first through N-th taps 12-1, 12-2, 12-3, 12-4, ..., 12-(N−1), and 12-N. The input data signal IN is supplied to the delay circuit 12. The delay circuit 12 comprises first through (N−1)-th delay units 14-1, 14-2, 14-3, 14-4, ..., 14-(N−2), and 14-(N−1). The first delay unit 14-1 is placed between the first and the second taps 12-1 and 12-2. The second delay unit 14-2 is placed between the second and the third taps 12-2 and 12-3. In general, an (n−1)-th delay unit 14-(n−1) is placed between an (n−1)-th and an n-th taps 12-(n−1) and 12-n, where n is variable between two and N, both inclusive. Each of the first through the (N−1)-th delay units 14-1 to 14-(N−1) provides a unit delay T which is substantially equal to a reciprocal of the operation frequency $Nf_s$. The input signal IN is delivered to the first tap 12-1 as a first tap signal and successively delayed by the first through the (N−1)-th delay units 14-1 to 14-(N−1) to be produced as second through N-th tap signals which are sent to the second through the N-th taps 12-2 to 12-N, respectively.

Since the first tap signal is identical with the input data signal IN with no delay, it may be called a zeroth delayed signal. Likewise, the second through the N-th tap signals may be referred to as first through (N−1)-th delayed signals, respectively. At any rate, the delay circuit 11 produces the zeroth through the (N−1)-th delayed signals.

The zeroth through the (N−1)-th delayed signals are supplied to an adding circuit 16. The adding circuit 16 adds up N terms of the zeroth through the (N−1)-th delayed signals to produce an addition result signal indicative of an addition result of the N terms. The addition result signal is supplied to a multiplying circuit 18 which is provided with a coefficient (1/N). The multiplying circuit 18 multiplies the addition result signal by the coefficient (1/N) to produce, as the output data signal OUT, a product signal indicative of a product of the addition result signal and the coefficient (1/N).

It is assumed that the input data signal IN comprises a series of input data elements such as a first input data element IN(1) of a first time slot 1, a second input data element IN(2) of a second time slot 2, . . . , an (N−1)-th input data element IN(N−1) of an (N−1)-th time slot (N−1), an N-th input data element IN(N) of an N-th time slot N. In this event, the output data signal OUT comprises a series of output data elements such as an N-th output data element OUT(N) of the N-th time slot N which is given by:

$$OUT(N) = (1/N) \sum_{n=1}^{N} IN(n).$$

That is, the N-th output data element OUT(N) represents a moving average of the first through the N-th input data elements IN(0) to IN(N). Accordingly, the FIR type filtering circuit 10 acts as the moving average filter.

When the FIR type filtering circuit 10 is used as the interpolation circuit in a digital-to-analog converter (ADC) of oversampling type, the FIR type filtering circuit 10 cannot sufficiently attenuate an image signal included in, the input data signal IN. It is therefore necessary for the interpolation circuit to use a plurality of FIR type filtering circuits. It results in increase of a scale of the digital-to-analog converter, as mentioned in the preamble of the instant specification.

Figure 2:
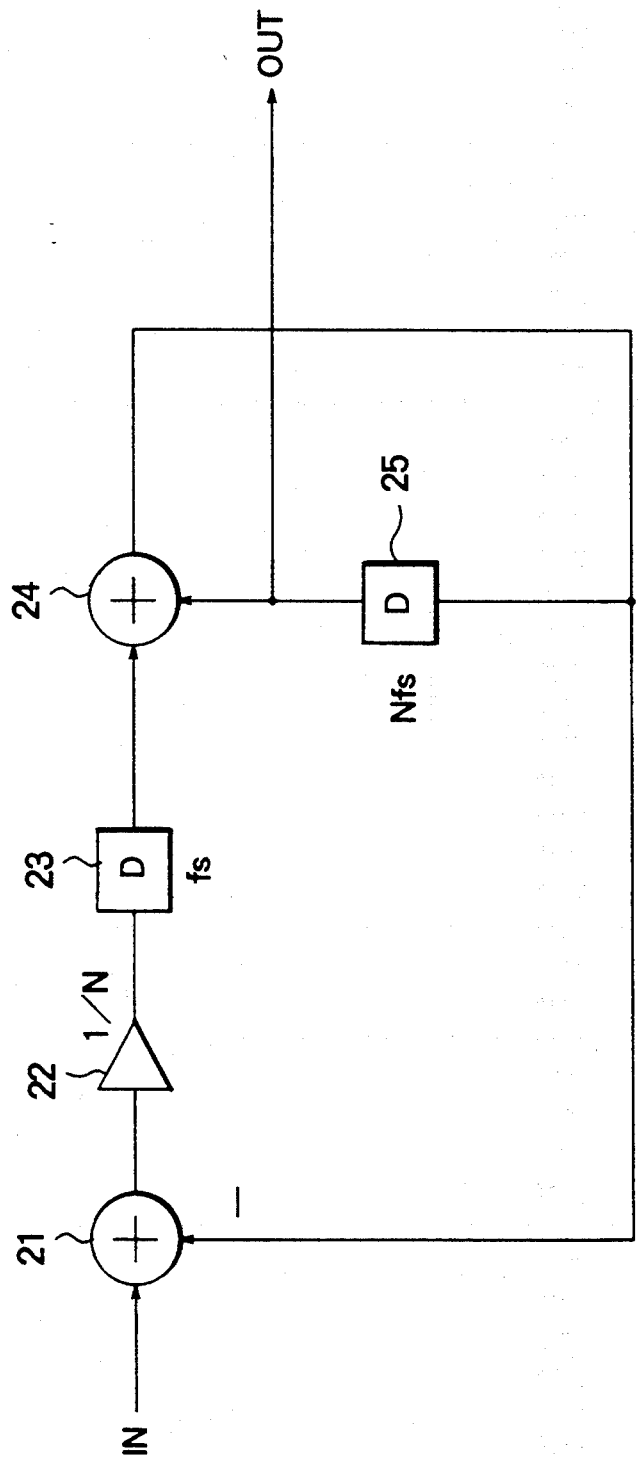
FIG. 2 is a block diagram of another conventional digital filtering circuit or a linear interpolating circuit.

Referring to FIG. 2, another digital filtering circuit will be described in order to facilitate an understanding of the present invention. The illustrated digital filtering circuit is a linear interpolating circuit 20 which is disclosed in the above-mentioned paper. The linear interpolating circuit 20 serves as a two-stage moving average filter.

The linear interpolating circuit 20 filters an input data signal IN into an output data signal OUT. The input data signal IN is a data signal which is sampled at a sampling frequency $f_s$. The linear interpolating circuit 20 is operable at the oversampling frequency $Nf_s$.

The linear interpolating circuit 20 comprises a subtracting circuit 21, a multiplying circuit 22, a first latch circuit 23, an adding circuit 24, and a second latch circuit 25.

The input data signal IN is supplied to the subtracting circuit 21. The subtracting circuit 21 is supplied with an addition result signal from the adding circuit 24. The subtracting circuit 21 subtracts the addition result signal from the input signal IN to produce a subtraction result signal indicative of a subtraction result. The subtraction result signal is supplied to the multiplying circuit 22. The multiplying circuit 22 is provided with a coefficient (1/N). The multiplying circuit 22 multiplies the subtraction result signal by the coefficient (1/N) to produce a product signal indicative of a product of the subtraction result signal and the coefficient (1/N). The product signal is supplied to the first latch circuit 23. The first latch circuit 23 latches the product signal at the sampling frequency $f_s$ to produce a first latched signal. The first latched signal is supplied to the adding circuit 24. The adding circuit 24 is supplied with a second latched signal from the second latch circuit 25. The adding circuit 24 adds the first latched signal and the second latched signal to produce the addition result signal indicative of an addition result. The addition result signal is supplied to the second latch circuit 25. The second latch circuit 25 latches the addition result signal at the oversampling frequency $Nf_s$ to produce the second latched signal as the output data signal OUT.

Attention will be directed to an n-th input data element $X_n$ of the input data signal IN which is supplied to the linear interpolating circuit 20. It will be assumed that the adding circuit 24 produces the addition result signal which is equal to an (n−1)-th input data element $X_{n-1}$. At this timing, the first and the second latch circuits 23 and 25 latch the product signal and the addition result signal, respectively. In this event, the first latch circuit 23 produces the first latched signal of $(X_n - X_{n-1})/N$. The second latch circuit 25 produces the second latched signal of $X_{n-1}$. In addition, the addition circuit 24 produces the addition result signal of $\{X_{n-1} + (X_n X_{n-1})/N\}$.

As described above, the first latch circuit 23 is operable in synchronism with the sampling frequency $f_s$ of the input data signal IN while the second latch circuit 25 is operable in synchronism with the oversampling frequency $Nf_s$. At the next timing of the oversampling frequency $Nf_s$, the second latch circuit 25 produces the first latched signal of $\{X_{n-1} + (X_n X_{n-1})/N\}$ and the adding circuit 24 produces the addition result signal of $\{X_{n-1} + 2(X_n X_{n-1})/N\}$. When this operation is repeated N times, the next or an (n+1)-th input element $X_{n+1}$ of the input data signal IN is supplied to the linear interpolating circuit 20. In this event, the adding circuit 24 produces the addition result signal of $\{X_{n-1} + N(X_n - X_{n-1})/N\}$, namely, of $X_n$.

As a result, the linear interpolating circuit 20 produces the output data signal OUT which linearly interpolates (N−1) interpolation elements between the (n−1)-th and the n-th input data elements $X_{n-1}$ and $X_n$. That is, the linear interpolating circuit 20 serves as the two-stage moving average filter.

Description will proceed to a case to design the digital-to-analog converter of the oversampling type for oversampling Nyquist sampled digital data of a Nyquist rate of 50 kHz at an oversampling frequency which is sixty-four times the Nyquist rate into an oversampled signal and for converting the oversampled signal into an analog signal. It is assumed that a signal out of a desired frequency band needs attenuating so as to ensure attenuation of 50 dB. To reduce a scale of the digital-to-analog converter, the linear interpolating circuit 20 illustrated in FIG. 2 is used as the second stage digital filtering circuit.

At first, it decides what times of the Nyquist rate does the first stage digital filtering circuit (the advanced low-pass filter) raise the sampling rate to. The moving average filter has a frequency response which is given by:

$$H(\omega T) = \left\{ \frac{1}{N} \cdot \frac{\sin(N\omega T/2)}{\sin(\omega T/2)} \right\}^M,$$

where $\omega$ is equal to $2\pi f$, T is equal to $1/Nf_s$, $f_s$ represents the sampling frequency of the input data signal IN for the moving average filter, N represents the tap number of the moving average filter, namely, a rate conversion ratio, M represents the stage number of the moving average filter. In the linear intepolating circuit 20 illustrated in FIG. 2, the stage number M is equal to two.

Under the above condition, the linear interpolating circuit 20 has the oversampling frequency $Nf_s$ of sixty-four times 50 kHz. In addition, the image signal has the most lowest frequency $f_I$ which is equal to the sampling frequency $f_s$ minus 25 kHz. When the rate conversion ratio N is calculated so as to ensure attenuation of 50 dB for the image signal under this condition, the rate conversion rate N is equal to six or less. Inasmuch as the oversampling frequency $Nf_s$ is sixty-four times the Nyquist rate, the rate conversion ratio N of six cannot be selected. This is because sixty-four is irreducible by six. When the rate conversion ratio N of four is selected, the first stage digital filtering circuit must have an output frequency of 0.8 MHz. It is difficult for such a first stage digital filtering circuit to be implemented by the digital signal processor (DSP). In addition, it is difficult to realize the first stage digital filtering circuit on a large scale integration (LSI) chip. This is because the digital signal processor occupies a large area on the LSI chip. When the rate conversion ratio N of eight is selected, the first stage digital filtering circuit has the output frequency of 0.4 MHz. However, such a digital-to-analog converter cannot satisfy the attenuation of 50 dB for the image signal.

Figure 3:
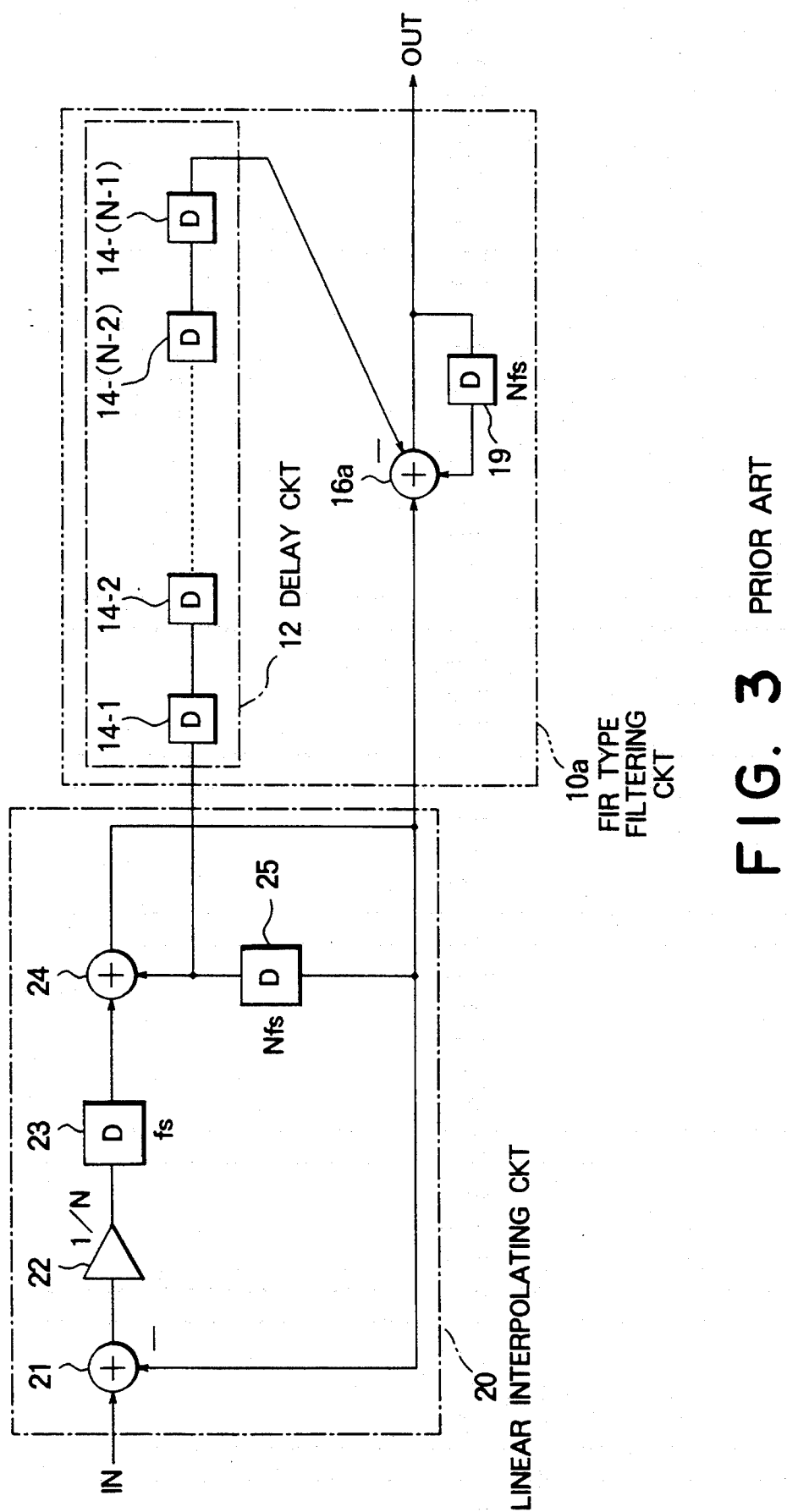
FIG. 3 is a block diagram of a still another conventional digital filtering circuit or a linear interpolating circuit with an FIR type filter.

To resolve the above-mentioned problem, another digital filtering circuit illustrated in FIG. 3 is proposed. The illustrated digital filtering circuit comprises the linear interpolating circuit 20 and an FIR type filtering circuit 10a which is connected to the linear interpolating circuit 20 in cascade fashion. The digital filtering circuit is therefore called a linear interpolating circuit with an FIR type filter.

The FIR type filtering circuit 10a comprises the delay circuit 12, a calculating circuit 16a, and a third latch circuit 19. The delay circuit 12 is supplied with the second latched signal from the second latch circuit 25. The delay circuit 12 comprises the first through the (N−1)-th delay units 14-1 to 14-(N−1). The delay circuit 12 delays the second latched signal to produce the (N−1)-th delayed signal. The (N−1)-th delayed signal is supplied to the calculating circuit 16a. The calculating circuit 16a is supplied with the addition result signal from the adding circuit 24. The calculating circuit 16a is furthermore supplied with a third latched signal from the third latch circuit 19. The calculating circuit 16a calculates the addition result signal plus the third latched signal minus the (N−1)-th delayed signal to produce a calculated signal. The calculated signal is supplied to the third latch circuit 19. The third latch circuit 19 latches the calculated signal at the oversampling frequency $Nf_s$ to produce the third latched signal. That is, a combination of the calculating circuit 16a and the third latch circuit 19 serves as an accumulating circuit for accumulating the addition result signal and the (N−1)-th delayed signal to produce an accumulated signal as the calculated signal. The FIR type filtering circuit 10a produces the accumulated signal as an output data-signal OUT.

The digital filtering circuit illustrated in FIG. 3 still occupies the large area on the LSI chip. In addition, it is necessary for the accumulating circuit to reset.

Attention will be directed to a case where the second stage digital filtering circuit is implemented by a three-stage moving average filter. In this event, the rate conversion ratio N is not greater than sixteen under the above-mentioned condition and the first stage digital filtering circuit has therefore the output frequency of 0.2 MHz. Such a second stage digital filtering circuit can be realized on the LSI chip. When the image signal needs attenuating in large attenuation, it is easily possible for the digital-to-analog converter to realize on the LSI chip if the three-stage moving average filter is used as the second stage digital filtering circuit. This is because this makes the burden light for the first stage digital filtering circuit.

Figure 4:
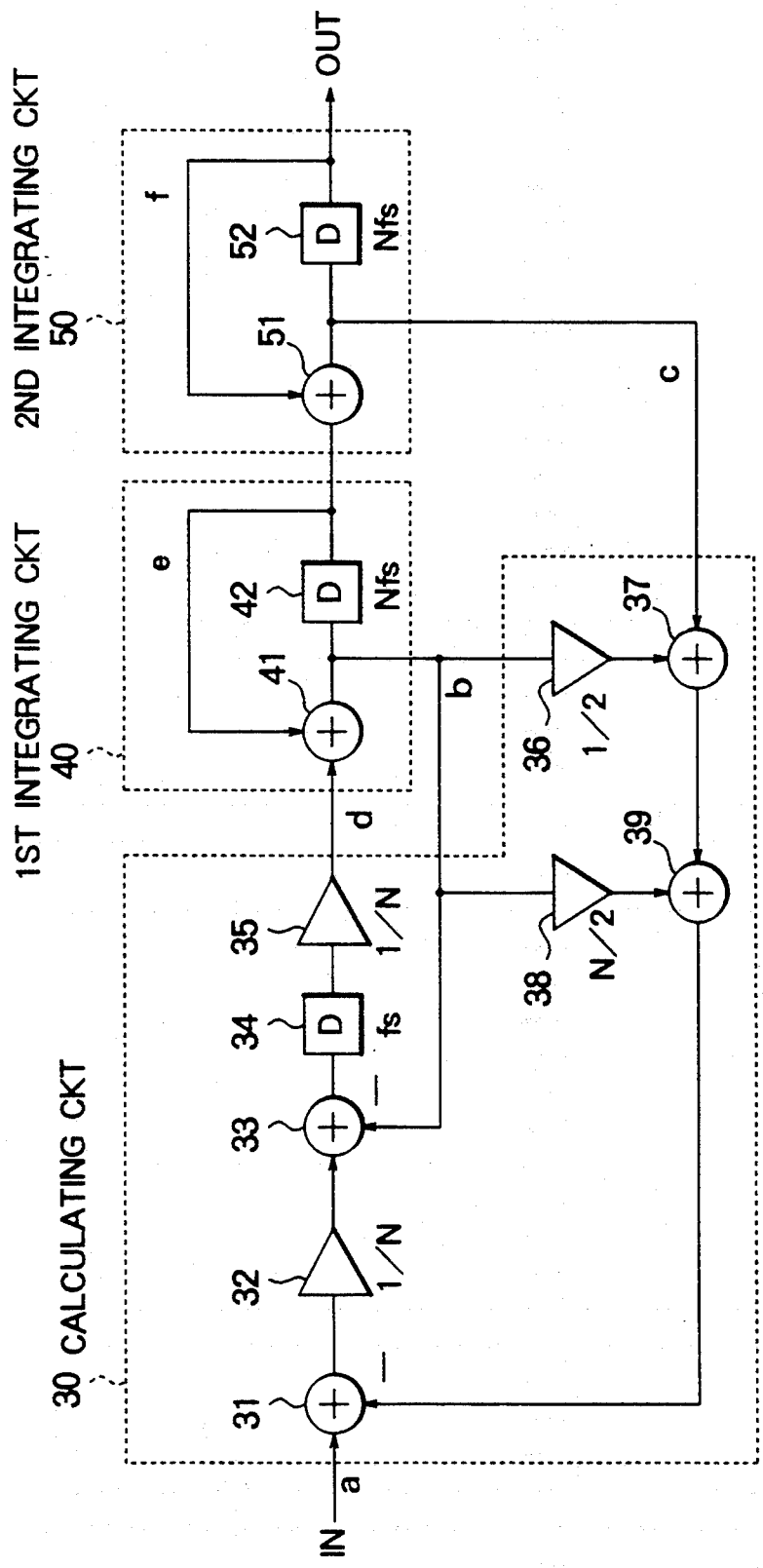
FIG. 4 is a block diagram of a digital filtering circuit according to a first embodiment of this invention.

Referring to FIG. 4, the description will proceed to a digital filtering circuit according to a first embodiment of this invention. The digital filtering circuit is an interpolation filter for converting an input data signal IN of the sampling frequency $f_s$ into an output data signal OUT of the oversampling frequency $Nf_s$.

The digital filtering circuit comprises a calculating circuit 30, a first integrating circuit 40, and a second integrating circuit 50. The calculating circuit 30 comprises a first subtracting circuit 31, a first multiplying circuit 32, a second subtracting circuit 33, a primary latch circuit 34, second and third multiplying circuits 35 and 36, a first primary adding circuit 37, a fourth multiplying circuit 38, and a second primary adding Circuit 39. The first integrating circuit 40 comprises a first subsidiary adding circuit 41 and a first subsidiary latch circuit 42. The second integrating circuit 50 comprises a second subsidiary adding circuit 51 and a second subsidiary latch circuit 52.

In the calculating circuit 30, the input data signal IN or a is supplied to the first subtracting circuit 31. The first subtracting circuit 31 is supplied with a feedback signal which will later become clear. The first subtracting circuit 31 subtracts the feedback signal from the input data signal IN to produce a first subtraction result signal. The first subtraction result signal is supplied to the first multiplying circuit 32. The first multiplying circuit 32 is provided with a first coefficient (1/N). The first multiplying circuit 32 multiplies the first subtraction result signal by the first coefficient (1/N) to produce a first product signal indicative of a first product of the first subtraction result signal and the first coefficient (1/N). The first product signal is supplied to the second subtracting circuit 33. The second subtracting circuit 33 is supplied with a first integration result signal b from the first integrating circuit 40. The second subtracting circuit 33 subtracts the first integration result signal b from the first product signal to produce a second subtraction result signal.

The second subtraction result signal is supplied to the primary latch circuit 34. The primary latch circuit 34 latches the second subtraction result signal at the sampling frequency $f_s$ to produce a primary latched signal. The primary latched signal is supplied to the second multiplying circuit 35. The second multiplying circuit 35 is provided with a second coefficient (1/N). The second multiplying circuit 35 multiplies the primary latched signal by the second coefficient (1/N) to produce a second product signal indicative of a second product of the first latched signal and the second coefficient (1/N). The second product signal is supplied to the first integrating circuit 40 as a calculated signal d of the calculator circuit 30.

The first integration result signal b is also supplied to the third multiplying circuit 36. The third multiplying circuit 36 is provided with a third coefficient (1/2). The third multiplying circuit 36 multiplies the first integration result signal by the third coefficient (1/2) to produce a third product signal indicative of a third product of the first integration result signal and the third coefficient (1/N). The third product signal is supplied to the first primary adding circuit 37. The first primary adding circuit 37 is supplied with a second integration result signal c from the second integrating circuit 50. The first primary adding circuit 37 adds the third product signal to the second integration result signal c to produce a first primary addition result signal.

The first integration result signal b is furthermore supplied to the fourth multiplying circuit 38. The fourth multiplying circuit 38 is provided with a fourth coefficient (N/2). The fourth multiplying circuit 38 multiplies the first integration result signal b by the fourth coefficient (N/2) to produce a fourth product signal indicative of a fourth product of the first integration result signal and the fourth coefficient (N/2). The fourth product signal is supplied to the second primary adding circuit 39. The second primary adding circuit 39 is supplied with the first primary addition result signal from the first primary adding circuit 37. The second primary adding circuit 39 adds the fourth product signal to the first primary addition result signal to produce a second primary addition result signal. The second primary addition result signal is fed back to the first subtracting circuit 31 as the feedback signal.

In the first integrating circuit 40, the first subsidiary adding circuit 41 is supplied with the calculated signal d from the calculating circuit 30. The first subsidiary adding circuit 41 is supplied with a first subsidiary latched signal e from the first subsidiary latch circuit 42. The first subsidiary adding circuit 41 adds the calculated signal d to the first subsidiary latched signal to produce a first subsidiary addition result signal as the first integration result signal b. The first integration result signal b is supplied to the first subsidiary latch circuit 42. The first subsidiary latch circuit 42 latches the first integration result signal b at the oversampling frequency $Nf_s$ to produce the first subsidiary latched signal e. That is, the first subsidiary latched signal e is given by delaying the first integration result signal b by a delay T which is substantially equal to a reciprocal of the oversampling frequency $Nf_s$. The first subsidiary latched signal e is supplied to the second integrating circuit 50.

In the second integrating circuit 50, the second subsidiary adding circuit 51 is supplied with the first subsidiary latched signal e. The second subsidiary adding circuit 51 is supplied with a second subsidiary latched signal f from the second subsidiary latch circuit 52. The second subsidiary adding circuit 51 adds the first subsidiary latched signal e to the second subsidiary latched signal f to produce a second subsidiary addition result signal as the second integration result signal c. The second integration result signal c is supplied to the second subsidiary latch circuit 52. The second subsidiary latch circuit 57 latches the second integration result signal c at the oversampling frequency $Nf_s$ to produce the second subsidiary latched signal f. That is, the second subsidiary latched signal f is given by delaying the second integration result signal c by the delay T. The second subsidiary latched signal f is produced as the output data signal OUT.

As well known in the art, a method of checking an impulse response of a digital filter is most effective in confirming a characteristic of the digital filter. Verification will be made as regards the digital filtering circuit illustrated in FIG. 4 is equal to the three-stage moving average filter on the basis of the impulse response in a case where the rate conversion ratio N is equal to four as similar to that of the prior art.

At first, it is assumed that the digital filtering circuit illustrated in FIG. 4 has an initial condition which is initialized to zero and the digital filtering circuit is supplied with the input data signal a of zero. Under the circumstances, all of the first and the second integration result signals b and c, and the output data signal f have a value of zero. In this event, it is presumed that an impulse of a data rate of $1/f_s$ is supplied as the input data signal IN or a to the digital filtering circuit illustrated in FIG. 4. Table 1 represents operation of this case as follows:

TABLE 1

| STEP ($4f_s$) | a(IN) | b | c | d | e | f(OUT) |
|---|---|---|---|---|---|---|
| 0 | 1 | 0 | 0 | 0 | 0 | 0 |
| 1 | 1 | 0 | 0 | 0 | 0 | 0 |
| 2 | 1 | 0 | 0 | 0 | 0 | 0 |
| 3 | 1 | 0 | 0 | 0 | 0 | 0 |
| 4 | 0 | 1/16 | 0 | 1/16 | 0 | 0 |
| 5 | 0 | 2/16 | 1/16 | 1/16 | 1/16 | 0 |
| 6 | 0 | 3/16 | 3/16 | 1/16 | 2/16 | 1/16 |
| 7 | 0 | 4/16 | 6/16 | 1/16 | 3/16 | 3/16 |
| 8 | 0 | 2/16 | 10/16 | −2/16 | 4/16 | 6/16 |
| 9 | 0 | 0 | 12/16 | −2/16 | 2/16 | 10/16 |
| 10 | 0 | −2/16 | 12/16 | −2/16 | 0 | 12/16 |
| 11 | 0 | −4/16 | 10/16 | −2/16 | −2/16 | 12/16 |
| 12 | 0 | −3/16 | 6/16 | 1/16 | −4/16 | 10/16 |
| 13 | 0 | −2/16 | 3/16 | 1/16 | −3/16 | 6/16 |
| 14 | 0 | −1/16 | 1/16 | 1/16 | −2/16 | 3/16 |
| 15 | 0 | 0 | 0 | 1/16 | −1/16 | 1/16 |
| 16 | 0 | 0 | 0 | 0 | 0 | 0 |
| 17 | 0 | 0 | 0 | 0 | 0 | 0 |
| 18 | 0 | 0 | 0 | 0 | 0 | 0 |

In Table 1, first through eighteenth steps are indicated along a first column on the left in Table 1 by numerals 0 through 18. The input data signal IN or a is indicated along a second column from the left. Third and fourth column from the left show the first and the second integration result signals b and c, respectively. A fifth column from the left shows the calculated signal d. A sixth column from the left shows the first subsidiary latched signal e. A seventh column from the left or a first column from the right shows the second subsidiary latched signal f or the output data signal OUT.

When the input data signal a becomes a value of one at the zeroth step 0, the calculated signal d having a value of one-sixteenths is present at the fourth step 4 after delayed by the primary latch circuit 34 by four steps. The first integrating circuit 40 accumulates the calculated signal d every step or time duration ($1/4f_s$) which is equal to a reciprocal of the oversampling frequency of $4f_c$. The first integrating circuit 40 produces the first integration result signal b and the first subsidiary latched signal e. Likewise, the second integrating circuit 50 accumulates the first subsidiary latched signal e every step ($1/4f_s$). The primary latch circuit 34 renews its contents or the primary latched signal every four steps ($1/f_s$). Simultaneously, the calculated signal d is renewed. That is, the calculating circuit 30 carries out a predetermined calculation which is represented by an equation as follows:

$$d = \left(a - c - \frac{3N+1}{2} b\right)/N^2$$

Table 2 represents an impulse response of a three-stage moving average filter comprising three four-tap moving average filters which are connected to one another in cascade fashion.

TABLE 2

| STEP NO. | INPUT | OUTPUT |
|---|---|---|
| −∞ | 0 | 0 |
| . | . | . |
| . | . | . |
| . | . | . |
| −1 | 0 | 0 |
| 0 | 1 | 1/64 |
| 1 | 0 | 3/64 |
| 2 | 0 | 6/64 |
| 3 | 0 | 10/64 |
| 4 | 0 | 12/64 |
| 5 | 0 | 12/64 |
| 6 | 0 | 10/64 |
| 7 | 0 | 6/64 |
| 8 | 0 | 3/64 |
| 9 | 0 | 1/64 |
| 10 | 0 | 0 |
| 11 | 0 | 0 |
| 12 | 0 | 0 |

In Table 2, a first column on the left indicates steps. An input data signal INPUT is indicated along a second column from the left. A third column from the left or a first column from the right shows an output data signal OUTPUT.

As apparent from a comparison of Table 1 and Table 2, the digital filtering circuit illustrated in FIG. 4 has the impulse response which is similar to that of the three-stage moving average filter. The second subsidiary latched signal f or the output data signal OUT represented in Table 1 has values which are four times those of the output data signal OUTPUT represented in Table 2. This is because compensation for power is made as regards each value of the output data signal OUT which is correspondent with interpolation of four times.

In addition, the digital filtering circuit illustrated in FIG. 4 carries out a self-reset operation on malfunction such that any initial data signal is set in any of the primary latch circuit 34 and the first and the second subsidiary latch circuits 42 and 52. Accordingly, it is unnecessary to carry out a reset operation.

Table 3 shows an example of the self-reset operation in a case where the initial data signal having a value of one is set in each of the primary latch circuit 34 and the first and the second subsidiary latch circuits 42 and 52.

TABLE 3

| STEP ($4f_s$) | a(IN) | b | c | d | e | f(OUT) |
|---|---|---|---|---|---|---|
| 0 | 0 | 5/4 | 8/4 | 1/4 | 4/5 | 4/4 |
| 1 | 0 | 6/4 | 13/4 | 1/4 | 5/4 | 8/4 |
| 2 | 0 | 7/4 | 19/4 | 1/4 | 6/4 | 13/4 |
| 3 | 0 | 8/4 | 26/4 | 1/4 | 7/4 | 19/4 |
| 4 | 0 | 25/32 | 34/4 | −39/32 | 8/4 | 26/4 |
| 5 | 0 | −14/32 | 297/32 | −39/32 | 25/32 | 34/4 |
| 6 | 0 | −53/32 | 283/32 | −39/32 | −14/32 | 297/32 |
| 7 | 0 | −92/32 | 230/32 | −39/32 | −53/32 | 283/32 |
| 8 | 0 | −69/32 | 138/32 | 23/32 | −92/32 | 230/32 |
| 9 | 0 | −46/32 | 69/32 | 23/32 | −69/32 | 138/32 |
| 10 | 0 | −23/32 | 23/32 | 23/32 | −46/32 | 69/32 |
| 11 | 0 | 0 | 0 | 23/32 | −23/32 | 23/32 |
| 12 | 0 | 0 | 0 | 0 | 0 | 0 |
| 13 | 0 | 0 | 0 | 0 | 0 | 0 |
| 14 | 0 | 0 | 0 | 0 | 0 | 0 |
| 15 | 0 | 0 | 0 | 0 | 0 | 0 |
| 16 | 0 | 0 | 0 | 0 | 0 | 0 |
| 17 | 0 | 0 | 0 | 0 | 0 | 0 |
| 18 | 0 | 0 | 0 | 0 | 0 | 0 |

Furthermore, in the above embodiment, the first through the fourth multiplying circuits 32, 35, 36, and 38 are provided with the first through the fourth coefficients which are equal to (1/4), (1/4), (1/2), and 2, respectively, and all of which are powers of 2. Accordingly, multiplication for the first through the fourth multiplying circuits 32, 35, 36, and 38 can be carried out by bit shift operation and each of the first through the fourth multiplying circuits 32, 35, 36, and 38 is therefore implemented by a shift register. As a result, the digital filtering circuit is realized by a small-scale circuit which includes four adding circuits 37, 39, 41, and 51, two subtracting circuits 31 and 33, and three latch circuits 33, 42, and 52.

In addition, the conventional digital filtering circuit illustrated in FIG. 3 comprises the FIR type filtering circuit 10a including the delay circuit 12 which consists of the number of the delay units 14-1 to 14-(N−1) when the rate conversion ratio N increases. In comparison with this, the digital filtering circuit illustrated in FIG. 4 has a fixed circuit scale although the rate conversion ratio N increases.

Figure 5:
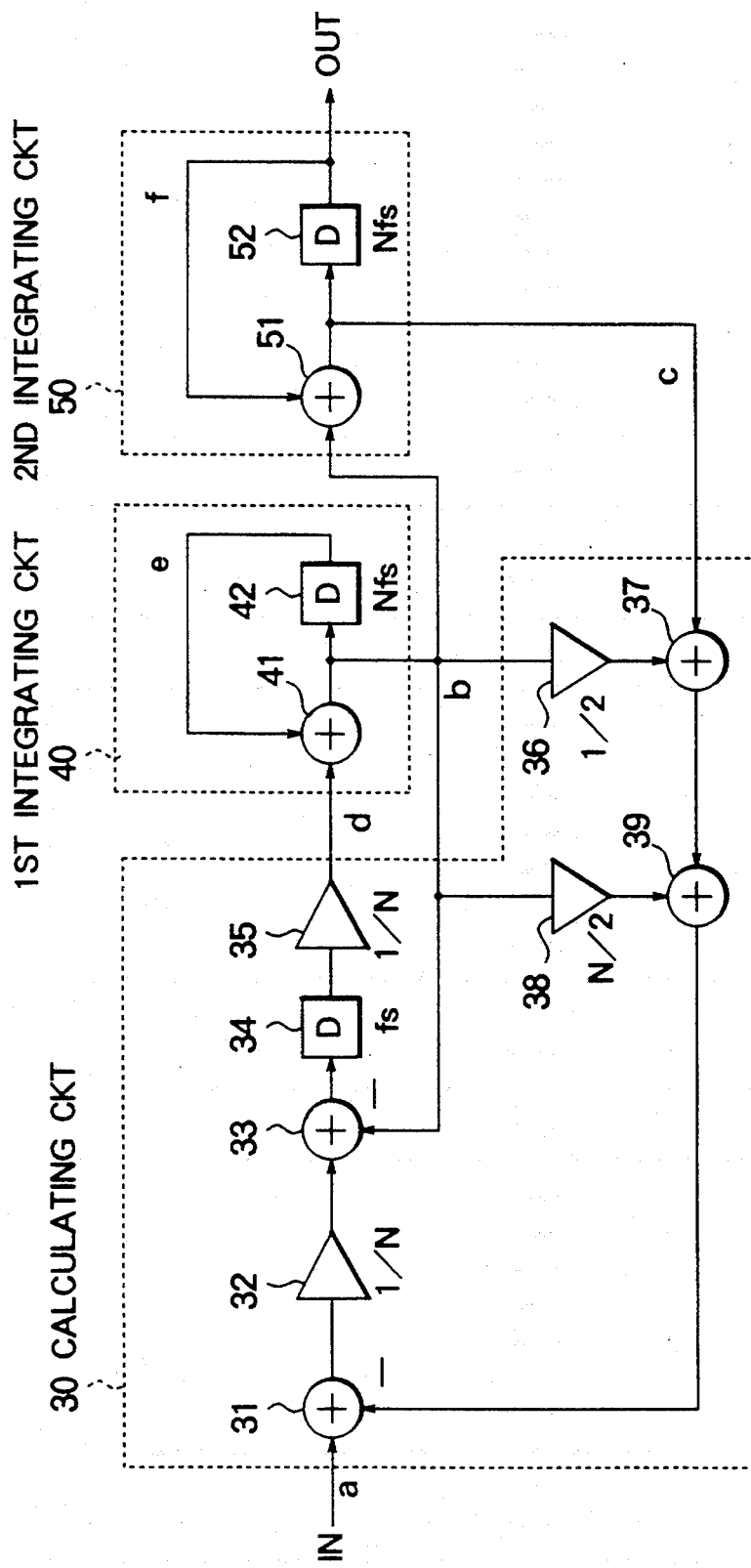
FIG. 5 is a block diagram of a digital filtering circuit according to a second embodiment of this invention.

Turning to FIG. 5, a digital filtering circuit according to a second embodiment of this invention is similar to that illustrated in FIG. 4 except that the first integration result signal b is supplied to the second integrating circuit 50 in place of the first subsidiary latched signal e.

While this invention has thus far been described in conjunction with a few preferred embodiments thereof, it will now readily be possible for one skilled in the art to develop various other embodiments of this invention.

What is claimed is:

1. A digital filtering circuit for converting an input data signal of a sampling frequency $f_s$ into an output data signal of an oversampling frequency $Nf_s$ which is N times the sampling frequency $f_s$, where N represents a predetermined positive integer which is not less than two, said digital filtering circuit comprising:
a first integrating circuit (40), supplied with a calculated signal, for integrating the calculated signal in synchronism with the oversampling frequency $Nf_s$ to produce a first integration result signal and a first delayed signal which is given by delaying the first integration result signal by a delay which is substantially equal to a reciprocal of the oversampling frequency $Nf_s$;
a second integrating circuit (50), connected to said first integrating circuit, for integrating the first delayed signal in synchronism with the oversampling frequency $Nf_s$ to produce a second integration result signal and a second delayed signal which is given by delaying the second integration result signal by the delay, said second integrating circuit producing the second delayed signal as the output data signal; and a calculating circuit (30), connected to said first and said second integrating circuits and supplied with the input data signal, for carrying out a predetermined calculation on the input data signal, the first integration result signal, and the second integration result signal in synchronism with the sampling frequency $f_s$ to produce the calculated signal, the predetermined calculation being represented by an equation as follows:

$$d=\{a-c-(1+3N)b/2\}/N^2,$$

where a represents the input data signal, b represents the first integration result signal, c represents the second integration result signal, and d represents the calculated signal.

2. A digital filtering circuit as claimed in claim 1, wherein said calculating circuit (30) comprises:

a first subtracting circuit (31), supplied with the input data signal and a feedback signal, for subtracting the feedback signal from the input data signal to produce a first subtraction result signal;

a first multiplying circuit (32), connected to said first subtracting circuit and provided with a first coefficient (1/N), for multiplying the first subtraction result signal by the first coefficient to produce a first product signal;

a second subtracting circuit (33), connected to said first multiplying circuit and supplied with the first integration result signal (b), for subtracting the first integration result signal from the first product signal to produce a second subtraction result signal;

a latch circuit (34), connected to said second subtracting circuit, for latching the second subtraction result signal at the sampling frequency $f_s$ to produce a latched signal;

a second multiplying circuit (35), connected to said latch circuit and provided with a second coefficient (1/N), for multiplying the latched signal by the second coefficient to produce a second product signal as the calculated signal;

a third multiplying circuit (36), connected to said first integrating circuit and provided with a third coefficient (1/2), for multiplying the first integration result signal by the third coefficient to produce a third product signal;

a first adding circuit (37), connected to said third multiplying circuit and said second integrating circuit, for adding the third product signal to the second integration result signal to produce a first addition result signal;

a fourth multiplying circuit (38), connected to said first integrating circuit and provided with a fourth coefficient (N/2), for multiplying the first integration result signal by the fourth coefficient to produce a fourth product signal; and a second adding circuit (39), connected to said fourth multiplying circuit and said first adding circuit, for adding the fourth product signal to the first addition result signal to produce a second addition result signal as the feedback signal.

3. A digital filtering circuit as claimed in claim 2, wherein the predetermined positive integer N is equal to power of 2, each of said first through said fourth multiplying circuits being implemented by a shift register.

4. A digital filtering circuit as claimed in claim 1, wherein said first integrating circuit (40) comprises:

a first adding circuit (41), connected to said calculating circuit and supplied with the first delayed signal, for adding the calculated signal to the first delayed signal to produce a first addition result signal as the first integration result signal; and a first latch circuit (42), connected to said first adding circuit, for latching the first integration result signal at the oversampling frequency $Nf_s$ to produce a first latched signal as the first delayed signal;

said second integrating circuit (50) comprising:

a second adding circuit (51), connected to said first integrating circuit and supplied with the second delayed signal, for adding the first delayed signal to the second delayed signal to produce a second addition result signal as the second integration result signal; and a second latch circuit (52), connected to said second adding circuit, for latching the second integration result signal at the oversampling frequency $Nf_s$ to produce a second latched signal as the second delayed signal.

5. A digital filtering circuit for converting an input data signal of a sampling frequency $f_s$ into an output data signal of an oversampling frequency $Nf_s$ which is N times the sampling frequency $f_s$, where N represents a predetermined positive integer which is not less than two, said digital filtering circuit comprising:

a first integrating circuit (40), supplied with a calculated signal, for integrating the calculated signal in synchronism with the oversampling frequency $Nf_s$ to produce a first integration result signal;

a second integrating circuit (50), connected to said first integrating circuit, for integrating the first integration result signal in synchronism with the oversampling frequency $Nf_s$ to produce a second integration result signal and a delayed signal which is given by delaying the second integration result signal by a delay which is substantially equal to a reciprocal of the oversampling frequency $Nf_s$, said second integrating circuit producing the delayed signal as the output data signal; and a calculating circuit (30), connected to said first and said second integrating circuits and supplied with the input data signal, for carrying out a predetermined calculation on the input data signal, the first integration result signal, and the second integration result signal in synchronism with the sampling frequency $f_s$ to produce the calculated signal, the predetermined calculation being represented by an equation as follows:

$$d=\{a-c-(1+3N)b/2\}/N^2,$$

where a represents the input data signal, b represents the first integration result signal, c represents the second integration result signal, and d represents the calculated signal.

6. A digital filtering circuit as claimed in claim 5, wherein said calculating circuit (30) comprises:

a first subtracting circuit (31), supplied with the input data signal and a feedback signal, for subtracting the feedback signal from the input data signal to produce a first subtraction result signal;

a first multiplying circuit (32), connected to said first subtracting circuit and provided with a first coefficient (1/N), for multiplying the first subtraction result signal by the first coefficient to produce a first product signal;

a second subtracting circuit (33), connected to said first multiplying circuit and supplied with the first integration result signal, for subtracting the first integration result signal from the first product signal to produce a second subtraction result signal;

a latch circuit (34), connected to said second subtracting circuit, for latching the second subtraction result signal at the sampling frequency $f_s$ to produce a latched signal;

a second multiplier circuit (35), connected to said latch circuit and provided with a second coefficient (1/N), for multiplying the latched signal by the second coefficient to produce a second product signal as the calculated signal;

a third multiplying circuit (36), connected to said first integrating circuit and provided with a third coefficient (1/2), for multiplying the first integration result signal by the third coefficient to produce a third product signal;

a first adding circuit (37), connected to said third multiplying circuit and said second integrating circuit, for adding the third product signal to the second integration result signal to produce a first addition result signal;

a fourth multiplying circuit (38), connected to said first integrating circuit and provided with a fourth coefficient (N/2), for multiplying the first integration result signal by the fourth coefficient to produce a fourth product signal; and a second adding circuit (39), connected to said fourth multiplying circuit and said first adding circuit, for adding the fourth product signal to the first addition result signal to produce a second addition result signal as the feedback signal.

7. A digital filtering circuit as claimed in claim 6, wherein the predetermined positive integer N is equal to power of 2, each of said first through said fourth multiplying circuits being implemented by a shift register.

8. A digital filtering circuit as claimed in claim 5, wherein said first integrating circuit (40) comprises:

a first adding circuit (41), connected to said calculating circuit and supplied with a first latched signal, for adding the calculated signal to the first latched signal to produce a first addition result signal as the first integration result signal; and a first latch circuit (42), connected to said first adding circuit, for latching the first integration result signal at the oversampling frequency $Nf_s$ to produce the first latched signal;

said second integrating circuit (50) comprising:

a second adding circuit (51), connected to said first integrating circuit and supplied with the delayed signal, for adding the first integration result signal to the delayed signal to produce a second addition result signal as the second integration result signal; and a second latch circuit (52), connected to said second adding circuit, for latching the second integration result signal at the oversampling frequency $Nf_s$ to produce a second latched signal as the delayed signal.

* * * * *